United States Patent [19]

Klüpfel et al.

[11] 4,241,166
[45] Dec. 23, 1980

[54] PHOTOPOLYMERIZABLE COMPOSITION COMPRISING A MONOAZO DYE AS CONTRAST COLORANT

[75] Inventors: Kurt Klüpfel; Heide Sprengel, both of, Wiesbaden; Walter Deucker; Hansjörg Vollmann, both of Bad Soden, all of Fed. Rep. of Germany

[73] Assignee: Hoechst Aktiengesellschaft, Fed. Rep. of Germany

[21] Appl. No.: 15,248

[22] Filed: Feb. 26, 1979

[30] Foreign Application Priority Data

Feb. 24, 1978 [DE] Fed. Rep. of Germany ....... 2807933

[51] Int. Cl.$^3$ ................................. G03C 1/68
[52] U.S. Cl. .................................. 430/281; 430/288; 430/292; 430/294; 430/339; 430/962
[58] Field of Search ............... 96/115 P, 89, 90 PC; 8/41 R; 430/281, 288, 292, 294, 339, 962

[56] References Cited

U.S. PATENT DOCUMENTS

| | | | |
|---|---|---|---|
| 2,281,895 | 5/1942 | von Poser et al. | 96/89 |
| 3,455,898 | 7/1969 | Seefelder et al. | 8/41 R |
| 4,058,443 | 11/1977 | Murata et al. | 96/115 P |
| 4,062,642 | 12/1977 | Deucker et al. | 8/41 R |
| 4,101,327 | 7/1978 | Frass | 96/115 P |

*Primary Examiner*—Won H. Louie, Jr.
*Attorney, Agent, or Firm*—James E. Bryan

[57] ABSTRACT

The present invention relates to a photopolymerizable mixture comprising a compound with at least two terminal ethylenically-unsaturated groups, a boiling point above 100° C. and which is capable of addition polymerization, a polymeric binder, a photoinitiator, and a monoazo dye corresponding to Formula I:

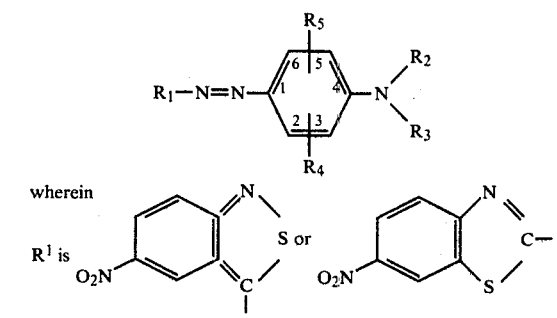

wherein $R^1$ is $R_2$ and $R_3$ are alkyl or alkenyl groups which may be substituted, and $R_4$ and $R_5$ are hydrogen or halogen atoms, or alkyl or alkoxy groups.

4 Claims, No Drawings

PHOTOPOLYMERIZABLE COMPOSITION COMPRISING A MONOAZO DYE AS CONTRAST COLORANT

The present invention relates to a photopolymerizable mixture which comprises polymerizable ethylenically-unsaturated compounds, polymeric binders, and photoinitiators.

Mixtures of this type which are used for the preparation of printing plates, etching and galvano resists, and relief images, are known and have been disclosed, e.g., in German Pat. Nos. 1,171,267, 2,027,467, and 2,039,861, in German Auslegeschrift No. 1,522,515, and in German Offenlegungsschrift No. 2,064,079.

Mixtures or copying materials of this type usually contain dyes or pigments in the photopolymerizable layer, in order to characterize different types of layers and to improve the visibility of the relief image after development. Of course, such colored additives should be as resistant to light as possible, because the stencil consisting of the light-hardened image areas, which remains after development, should be readily distinguishable.

Furthermore, it is known from German Offenlegungsschrift No. 2,331,377, e.g., to add a combination, comprising a certain dyestuff and a compound which forms an acid during exposure, to light-sensitive copying layers containing light-sensitive diazo compounds, so that the image in the layer can be distinguished immediately after exposure. In combinations of this type, and also if one of the many dyestuffs is used which bleach out during exposure, the exposed areas of the layer are only weakly colored. Consequently, in the case of negative-working, i.e. light-hardenable layers, there is only a weak visual contrast between the developed image stencil and the surface of the support.

It is the object of the present invention to provide a photopolymerizable mixture which is colored in such a manner that the copying layer produced therefrom is intensively colored before exposure and that an image which is rich in contrast can be distinguished both after exposure and after development of the material.

The invention is based on a photopolymerizable mixture which comprises a compound with at least two terminal ethylenically-unsaturated groups, a boiling point above 100° C. and which is capable of addition polymerization, a polymeric bind, a photoinitiator, and a dye.

The object of the present invention is achieved by using, as the dye, a monoazo dye corresponding to Formula I:

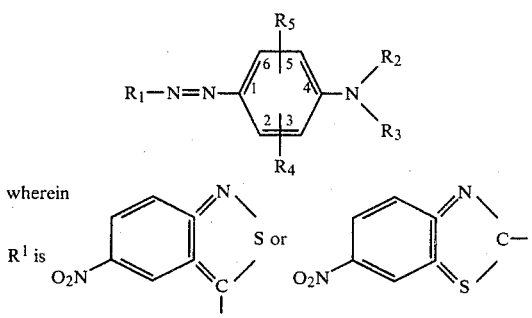

wherein $R^1$ is $R_2$ and $R_3$ are alkyl or alkenyl groups which may be substituted, and $R_4$ and $R_5$ are hydrogen or halogen atoms or alkyl or alkoxy groups.

Preferably, the groups $R_2$ and $R_3$ are either unsubstituted or substituted by hydroxy, alkoxy, cyano, acyloxy, alkoxycarbonyl, or alkylamino carbonyloxy groups, or by halogen atoms.

The unsubstituted alkyl or alkenyl groups $R_2$ and $R_3$ normally have from 1 to 8, preferably from 2 to 5 carbon atoms. The alkyl groups of the substituents generally have from 1 to 3, preferably only one carbon atom.

If the nuclear substituents $R_4$ and $R_5$ are alkyl or alkoxy groups, they preferably have from 1 to 3 carbon atoms. Preferably, at least one of the groups $R_4$ and $R_5$ is a hydrogen atom.

Chlorine or bromine are preferred as halogen atoms for the substituents of $R_2$ and $R_4$ and for the groups $R_4$ and $R_5$.

The dyes used in the mixture according to the present invention are known and have been disclosed in German Pat. No. 1,544,375, and in German Offenlegungsschrift No. 2,524,481.

If the photopolymerizable mixtures according to the invention are subjected to imagewise exposure in the form of solid, photopolymerizable layers, they show a clearly visible decolorization in the exposed areas, so that the recorded image is distinctly visible. Up to 50 percent of the original extinction is thus bleached out. If the exposed material is left alone, especially with the access of air oxygen, the original color density is gradually regained. After 60 minutes, up to 90 percent of the original extinction has been attained.

This surprising behavior of the dyes depends upon the combination with the other components of the photopolymerizable mixture. The dyes themselves do not show any bleaching out, either in the solid form or in solution, and thus do not undergo any regeneration of their covering power.

What is achieved by the present invention is that the imagewise exposure of the photopolymerizable layer can be immediately seen, and that after development, i.e. removal of the unexposed areas of the layer, a colored stencil which is rich in contrast is again produced after brief storage.

The light-sensitive mixture according to the present invention may be marketed in known manner in the form of a solution or dispersion which may be used by the customer especially for the preparation of etch resists. Preferably, the mixture according to the invention is used in the form of dry photoresist films which are composed of a temporary support with a dry thermoplastic photoresist layer thereon, the latter being applied by the customer to the surface to be etched or imagewise galvanized, then exposed, and finally developed, after the temporary support, normally a plastic film, has been stripped off.

The mixture according to the invention is particularly suitable for this purpose. Alternatively, it may be manufactured, on an industrial scale, in the form of a presensitized copying material on a suitable support, e.g. aluminum or zinc, for use in the photomechanical preparation of offset and relief printing forms. Furthermore, the mixture may be used for the preparation of relief images, screen printing stencils, color proofing films, and the like.

The mixture according to the invention is substantially composed of monomers, photoinitiators, binders, and the above described dyes. In addition thereto, it may contain various other additives, such as stabilizers or inhibitors to prevent the thermal polymerization of the copying layer, hydrogen donors, plasticizers, sensitometric regulators, and colorless pigments.

A great variety of substances may be used as photoinitiators, e.g.: benzoin, benzoin ether, multinuclear quinones, e.g. 2-ethyl-anthraquinone; acridine derivatives, e.g. 9-phenyl-acridine, 9-p-methoxy-phenyl-acridine, 9-acetylamino-acridine, benz(a)acridine; phenazine derivatives, e.g. 9,10-dimethyl-benz(a)-phenazine, 9-methyl-benz(a)-phenazine, 10-methoxy-benz(a)-phenazine; quinoxaline derivatives, e.g. 6,4′,4″-trimethoxy-2,3-diphenylquinoxaline, 4′,4″-dimethoxy-2,3-diphenyl-5-aza-quinoxaline; quinazoline derivatives, synergistic mixtures of different ketones, dye/redox systems, thiopyrylium salts, and others.

Photopolymerizable monomeric substances which are suitable for the purposes of the present invention are known and are disclosed, e.g., in U.S. Pat. Nos. 2,760,863, and 3,060,023.

Particularly advantageous compounds are acrylic and methacrylic acid esters, such as diglycerol diacrylate, polyethyleneglycol dimethacrylate, and the acrylates and methacrylates of trimethylol ethane, trimethylol propane, and pentaerythritol and of polyhydric alicyclic alcohols. Reaction products of diisocyanates with partial esters of polyhydric alcohols are used with particular advantage. Monomers of this type are disclosed in German Offenlegungsschriften Nos. 2,064,079 and 2,361,041. As a rule, the methacrylates are preferred to the acrylates.

Aliphatic polyethers are mostly used as hydrogen donors. Alternatively, the function of the hydrogen donor may be assumed by the binder or by the polymerizable monomer, provided these compounds have unstable hydrogen atoms.

A great number of soluble organic polymers are suitable for use as binders. The following are mentioned as examples: polyamides, polyvinyl esters, polyvinyl acetals, polyvinyl ethers, polyacrylic acid esters, polymethacrylic acid esters, polyesters, alkyd resins, polyacrylamide, polyvinyl alcohol, polyethylene oxide, polydimethyl acrylamide, polyvinyl pyrrolidone, polyvinyl methyl formamide, polyvinyl methyl acetamide, and also copolymers of the monomers which form the homopolymers listed above.

Furthermore, natural substances or modified natural substances, such as gelatin, cellulose ethers and the like, may be used as binders.

Advantageously, those binders are used which are soluble or at least swellable in aqueous-alkaline solutions, because layers containing such binders can be developed with the preferred aqueous-alkaline developers. Such binders may contain any of the following groupings, e.g.: —COOH, —PO$_3$H$_2$, —SO$_3$H, —SO$_2$NH$_2$, —SO$_2$—NH—CO, and the like. Examples of suitable binders in this type are: maleinate resins, polymers of N-(p-tolylsulfonyl)-carbamic acid-(β-methacryloyloxy-ethyl)-ester, and copolymers of these and similar monomers with other monomers, further styrene/maleic acid anhydride copolymers and methyl-methacrylate/methacrylic acid copolymers. Copolymers of methacrylic acid, alkylmethacrylates and methyl methacrylate and/or styrene, acrylonitrile and the like, such as those disclosed in German Offenlegungsschriften Nos. 2,064,080 and 2,363,806, are preferred.

Suitable supports for the copying materials prepared with the mixture according to the invention are, e.g., aluminum, steel, zinc or copper, and also plastic films, e.g. polyethylene terephthalate or cellulose acetate films. The surface of the support may be chemically or mechanically pretreated in order to adjust the exact degree of adhesion to the layer which is desired or to reduce the reflectivity of the support in the actinic range of the copying layer (anti-halo).

The light-sensitive materials containing the mixture according to the invention are prepared in known manner. Thus, it is possible, e.g., to introduce the mixture into a solvent and to apply the resulting solution or dispersion in the form of a film to the desired support by casting, spraying, immersion, roller application, or other suitable methods, whereupon the film is dried. Relatively thick layers (e.g. of 250 μm and more) may be extruded or molded into self-supporting films which are then laminated to the support.

The copying layers according to the present invention are exposed and developed in known manner. Suitable developers are, above all, aqueous-alkaline solutions, e.g. alkali phosphate, alkali borate, alkali carbonate, or alkali silicate solutions, to which small quantities of a wetting agent and/or of water-miscible organic solvents may be added, if desired. Aqueous solutions of aliphatic amines, which may be buffered in special cases, also may be used as alkaline solutions.

As already pointed out, the mixtures according to the invention may be used for a wide variety of applications. With particular advantage, they are used, either directly or in the form of a dry resist film, for the manufacture of resist layers, i.e. etch resists or galvano resists, on metal supports, e.g. copper supports; materials of this type may be used, i.a., for the preparation of printed circuits, of gravure printing forms, and of multi-metal offset printing forms.

The proportion of the above described monoazo dye in the photopolymerizable mixture according to the invention is generally within the range of 0.02 to 3 percent by weight, preferably between 0.1 and 1.0 percent by weight, based on the weight of the non-volatile components. The quantity of the polymerizable compounds present normally amounts to 20 to 80 percent by weight, calculated on the weight of the binder and the polymerizable compound. The photoinitiator content of the mixture normally ranges between 0.1 and 10 percent by weight of the non-volatile components.

The following Table I lists the monoazo dyes corresponding to Formula I which were tested in photopolymerizable mixtures according to the invention. In compounds 1 to 9, $R_1$ is the nitrobenzisothiazolyl group, and in compounds 10 to 11 it is the nitrobenzthiazolyl group. $R_5$ is a hydrogen atom in all compounds.

TABLE I

| Compound No. | $R_2$ | $R_3$ | $R_4$ | Color of the Layer | Extinction at λ max for 10 mg of dye per 1000 ml of methyl ethyl ketone |
|---|---|---|---|---|---|
| 1 | C$_2$H$_5$ | C$_2$H$_4$CN | 2-CH$_3$ | blue | 590 nm/0.667 |
| 2 | C$_2$H$_4$OH | C$_2$H$_4$OH | 2-Cl | deep blue | 593 nm/0.749 |

TABLE I-continued

| Compound No. | $R_2$ | $R_3$ | $R_4$ | Color of the Layer | Extinction at λ max for 10 mg of dye per 1000 ml of methyl ethyl ketone |
|---|---|---|---|---|---|
| 3 | $C_2H_4OH$ | $C_2H_4CN$ | H | blue-violet | 576 nm/0.822 |
| 4 | $C_2H_5$ | $C_2H_4OCONHCH_3$ | H | deep-blue | 589 nm/0.822 |
| 5 | $C_2H_4COOCH_3$ | $CH_2-CH=CH_2$ | 2-$CH_3$ | blue | 595 nm/0.646 |
| 6 | $C_2H_4OH$ | $CH_2-C(CH_3)=CH_2$ | H | blue | 593 nm/0.683 |
| 7 | $C_2H_4OH$ | $CH_2-CH=CH_2$ | H | deep blue | 592 nm/0.959 |
| 8 | $C_2H_4CN$ | $CH_2-CH=CH_2$ | H | violet | 568 nm/0.581 |
| 9 | $C_2H_4OH$ | $CH_2-CBr=CH_2$ | H | blue violet | 583 nm/0.622 |
| 10 | $C_2H_4CN$ | $C_2H_4OCOCH_3$ | H | red | 515 nm/1.223 |
| 11 | $C_2H_5$ | $C_2H_4CN$ | 2-$CH_3$ | red violet | 535 nm/1.350 |

The use of these dyes in photopolymerizable mixtures is further illustrated by the following examples:

EXAMPLE 1

A solution is prepared from the following components:

5.6 g of the reaction product of 1 mole of 2,2,4-trimethyl-hexamethylene-diisocyanate and 2 moles of 2-hydroxy-ethylmethacrylate, 6.5 g of a terpolymer of styrene, n-hexylmethacrylate, and methacrylic acid (10:60:30) with an acid number of about 190, 0.2 g of 9-phenylacridine, 0.15 g of triethyleneglycol dimethacrylate, 0.015 g of 4,4'-bis-dimethylamino-benzophenone, 0.035 g of a dye (compounds corresponding to Formulae 1 to 11), and 28.0 g of butanone-2.

The solution is whirler-coated onto a 25 μm thick, biaxially stretched and heat-set polyethylene terephthalate film in a manner such that a 25 μm thick (30 g/m²) layer results after drying. The layer is after-dried for 2 minutes at 100° C. in a drying cabinet.

In order to protect the thus produced layer from being soiled by dust or damaged, the layer is covered with a 25 μm thick cover film of polyethylene.

Normally, the copying material is processed in that, after removal of the cover film, the resist layer is laminated to a copper surface, exposed through the supporting film, then the supporting film is peeled off, and the non-hardened areas of the layer are removed by washing with a developer.

In the present case, however, the following process is applied in order to be better able to measure the bleaching-out and regenerating effect of the dyes used:

An area of size 20×40 mm is cut from the dry resist material, the cover film is stripped off, and the extinction of the unexposed layer is measured with the aid of an "Ulbricht" sphere-type photometer in a Zeiss spectrophotometer of type DM R-21. The measured values are listed in column 2 of Table II. Column 1 shows the absorption maxima, which are slightly displaced as compared with those of the pure dyestuff.

Another sample of the material, which is taken at the same time, is exposed for 16 seconds, without an original, under a 5 kW metal halide lamp sold by Messrs. Staub, Neu-Isenburg, Germany. In view of the low absorption of the cover film and the supporting film, it is immaterial from which side the material is exposed.

The transport from the exposure apparatus to the measuring station was assumed to take 4 minutes. The cover film was then peeled off, and the extinction was measured after another two minutes (column 3, Table II).

After 1 hour, the extinction was measured again (column 4 of Table II).

This procedure was repeated after 60 hours (column 5). After about 10 days, almost 100 percent of the original color density had been regained.

TABLE II

| No. of the dye and λ max of the photopolymerizable layer | Extinction of the unexposed layer (y) | Extinction of the exposed sample, measured after | | | $\frac{x}{y} \cdot 100$ | Increase of the extinction from 0.1 to 60 hrs. |
|---|---|---|---|---|---|---|
| | | 0.1 | 1 | 60 hrs. (X) | | |
| 1:597 nm | 0.590 | 0.36 | 0.48 | 0.48 | 81.35% | 0.120 |
| 1:595 nm | 0.608 | 0.41 | 0.54 | 0.58 | 95.4% | 0.170 |
| 3:585 nm | 0.642 | 0.39 | 0.549 | 0.575 | 89.56% | 0.185 |
| 4:595 nm | 0.694 | 0.469 | 0.588 | 0.595 | 85.75% | 0.126 |
| 5:605 nm | 0.631 | 0.398 | 0.47 | 0.49 | 77.7% | 0.092 |
| 6:596 nm | 0.560 | 0.328 | 0.45 | 0.47 | 83.9% | 0.142 |
| 7:600 nm | 0.886 | 0.610 | 0.773 | 0.780 | 88.0% | 0.170 |
| 8:575 nm | 0.508 | 0.202 | 0.410 | 0.452 | 88.9% | 0.250 |
| 9:580 nm | 0.511 | 0.309 | 0.440 | 0.442 | 86.5% | 0.133 |
| 10:525 nm | 0.805 | 0.477 | 0.670 | 0.735 | 91.3% | 0.258 |
| 11:545 nm | 0.949 | 0.590 | 0.725 | 0.810 | 85.2% | 0.220 |

EXAMPLE 2

A solution is prepared from the following components:

115.0 g of a 33 percent solution of a methylmethacrylate/methacrylic acid copolymer (82:18) in butanone-2, with an acid number of about 115, 39.2 g of trimethylol-ethane-triacrylate, 0.7 g of 9-phenyl-acridine, 0.7 g of 4-dimethylamino-4'-methyl-dibenzalacetone, 0.14 g of a dye, 42.0 g of ethyleneglycol monoethyl ether, and 14.0 g of n-butyl acetate.

The compounds corresponding to Formulae 3, 7, and 11 are used as dyes.

The different solutions containing these dyes are processed as described in Example 1.

The results are shown in the following Table III.

TABLE III

| No. of the dye and λ max of the photo-polymerizable layer | Extinction of the unexposed layer (y) | Extinction of the exposed sample, measured after 0.1 | Extinction of the exposed sample, measured after 1 | Extinction of the exposed sample, measured after 60 hrs. (X) | $\frac{x}{y} \cdot 100$ | Increase of the extinction from 0.1 to 60 hours |
|---|---|---|---|---|---|---|
| 3:580 nm | 0.503 | 0.261 | 0.37 | 0.38 | 75.5% | 0.119 |
| 7:597 nm | 0.650 | 0.381 | 0.471 | 0.475 | 73.0% | 0.094 |
| 11:545 nm | 0.893 | 0.568 | 0.72 | 0.73 | 81.7% | 0.162 |

It will be obvious to those skilled in the art that many modifications may be made within the scope of the present invention without departing from the spirit thereof, and the invention includes all such modifications.

What is claimed is:

1. A photopolymerizable mixture comprising a compound with at least two terminal ethylenically-unsaturated groups, a boiling point above 100° C. and which is capable of addition polymerization, a polymeric binder, a photoinitiator, and a monoazo dye corresponding to Formula I:

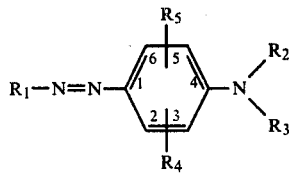

wherein $R^1$ is

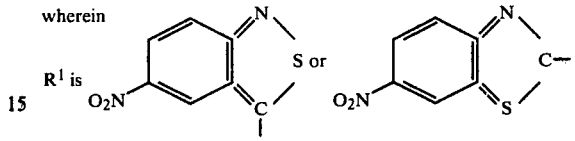

$R_2$ and $R_3$ are alkyl or alkenyl groups which may be substituted, and $R_4$ and $R_5$ are hydrogen or halogen atoms, or alkyl or alkoxy groups.

2. A photopolymerizable mixture according to claim 1 in which in the dye corresponding to Formula I:

$R_2$ and $R_3$ are alkyl or alkenyl groups which are substituted by hydroxy, alkoxy, cyano, acyloxy, alkoxycarbonyl or alkylamino carbonyloxy groups, or by halogen atoms.

3. A photopolymerizable mixture according to claim 1 which contains between about 0.1 and 1.0 percent by weight of a compound corresponding to Formula I, calculated on the weight of the nonvolatile components of the mixture.

4. A photopolymerizable mixture according to claim 1 in the form of a solid photopolymerizable layer on a support.